United States Patent
Chuang et al.

(10) Patent No.: US 7,087,958 B2
(45) Date of Patent: Aug. 8, 2006

(54) TERMINATION STRUCTURE OF DMOS DEVICE

(75) Inventors: Chiao-Shun Chuang, Hsinchu (TW);
Chien-Ping Chang, Hsinchu (TW);
Mao-Song Tseng, Hsinchu (TW);
Hsing-Huang Hsieh, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 2 days.

(21) Appl. No.: 10/771,957

(22) Filed: Feb. 3, 2004

(65) Prior Publication Data

US 2004/0195620 A1    Oct. 7, 2004

(30) Foreign Application Priority Data

Mar. 28, 2003  (CN) ................................ 92 1 07170

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/335; 257/328; 257/329; 257/330; 257/331; 257/332; 257/333; 257/334; 257/336; 257/337; 257/338; 257/339; 257/340; 257/341; 257/342; 257/343

(58) Field of Classification Search ........ 257/335–343, 257/328–334
See application file for complete search history.

(56) References Cited

U.S. PATENT DOCUMENTS

| | | | |
|---|---|---|---|
| 5,614,751 A * | 3/1997 | Yilmaz et al. ............... | 257/394 |
| 5,877,528 A * | 3/1999 | So ............................... | 257/341 |
| 5,895,951 A * | 4/1999 | So et al. ..................... | 257/330 |
| 5,910,669 A * | 6/1999 | Chang et al. ............... | 257/339 |
| 6,031,265 A * | 2/2000 | Hshieh ........................ | 257/334 |
| 6,043,125 A * | 3/2000 | Williams et al. ............ | 438/270 |
| 6,049,108 A * | 4/2000 | Williams et al. ............ | 257/341 |
| 6,309,929 B1 | 10/2001 | Hsu | |
| 6,509,608 B1 * | 1/2003 | Hueting ....................... | 257/330 |
| 6,657,255 B1 * | 12/2003 | Hshieh et al. .............. | 257/330 |
| 6,798,018 B1 * | 9/2004 | Takaishi et al. ............. | 257/334 |
| 6,803,628 B1 * | 10/2004 | Hamada ...................... | 257/342 |
| 6,833,583 B1 * | 12/2004 | In't Zandt et al. .......... | 257/329 |
| 6,833,584 B1 * | 12/2004 | Henninger et al. .......... | 257/334 |
| 2002/0195651 A1 * | 12/2002 | Miura et al. ................. | 257/328 |
| 2003/0080351 A1 * | 5/2003 | Hshieh et al. .............. | 257/200 |
| 2003/0178676 A1 * | 9/2003 | Henninger et al. ......... | 257/340 |
| 2004/0007723 A1 * | 1/2004 | Andoh et al. ................ | 257/284 |
| 2004/0056310 A1 * | 3/2004 | Probst ......................... | 257/367 |
| 2004/0145015 A1 * | 7/2004 | Mo et al. ..................... | 257/341 |
| 2005/0029557 A1 * | 2/2005 | Hatakeyama et al. ....... | 257/263 |

* cited by examiner

*Primary Examiner*—Ida M. Soward
(74) *Attorney, Agent, or Firm*—Townsend and Townsend and Crew LLP

(57) ABSTRACT

In one embodiment of the invention, a semiconductor device set includes at least one trench-typed MOSFET and a trench-typed termination structure. The trench-typed MOSFET has a trench profile and includes a gate oxide layer in the trench profile, and a polysilicon layer on the gate oxide layer. The trench-typed termination structure has a trench profile and includes an oxide layer in the trench profile. A termination polysilicon layer with discrete features separates the termination polysilicon layer. An isolation layer covers the termination polysilicon layer and filling the discrete features. The trench-typed MOSFET and the trench-typed termination structure may be formed on a DMOS device including an N+ silicon substrate, an N epitaxial layer on the N+ silicon substrate, and a P epitaxial layer on the N epitaxial layer. The trench profiles of the trench-typed MOSFET and of the trench-typed termination structure may penetrate through the P epitaxial layer into the N epitaxial layer.

13 Claims, 17 Drawing Sheets

TERMINATION STRUCTURE OF DMOS DEVICE

CROSS-REFERENCES TO RELATED APPLICATIONS

This application claims priority from R.O.C. Patent Application No. 092107170, filed Mar. 28, 2003, the entire disclosure of which is incorporated herein by reference.

BACKGROUND OF THE INVENTION

The present invention relates to a termination structure and more particularly to a termination structure applied to trenched DMOS devices.

The DMOS (diffused MOS) device is an important power transistor widely used in high voltage systems such as power suppliers, power control devices, etc. Among many known structures of power transistors, a trenched power transistor is a notable design. Some reports note that trenched MOS-FETs have better improvement than planar power MOSFETs in efficiency and integration.

FIG. 1A through FIG. 1F depict a sequence of steps to form a typical trenched DMOS device. In FIG. 1A, an N-type epitaxial layer 10 is formed on an N+ silicon substrate 1. A thermal oxidation process is then performed to grow an initial oxide layer 20 over a location of a termination structure. By using the initial oxide layer 20 as a mask, P-type dopants are implanted to form a P-type active area 12 in the epitaxial layer 10. In FIG. 1B, a plurality of DMOS trenches 13 extending from the P-type active area 12 to the epitaxial layer 10 below the P-type active area 12 is formed by etching. Afterward, an oxidation process is performed to form a gate oxide layer 21 over the P-type active area 12 and to make the initial oxide layer 20 become a field oxide layer 22. In FIG. 1C, a polysilicon layer is deposited by a chemical vapor depositing (CVD) process. The portion of the polysilicon layer on the surface of the epi layer 10 and outside the DMOS trenches is removed by etching, so that a plurality of poly gates 30 is formed respectively in the DMOS trenches 13. Afterward, as shown in FIG. 1D, a lithographic process is carried out to define a location of source regions 40 and to form a photoresist layer 40PR as a mask. N-type dopants are implanted into the active area 12 to form N+ source regions 40 surrounding the DMOS trenches 13. In FIG. 1E, an isolation layer 50 is formed. An etching process is performed to form a plurality of contact windows 51 of the active area over the N+ source regions 40. P-type dopants are implanted to form P+ regions 41 surrounding the N+ source regions 40. As shown in FIG. 1F, a metal contact layer 60 of the source regions is then deposited over the isolation layer 50. The metal contact layer 60 contacts the P-type active area 12 through the contact windows 51. The metal contact layer 60 has an opening over the field oxide layer 22 to expose the isolation layer 50. In addition, a metal contact layer 61 of drain regions is formed on the backside of the N+ silicon substrate 1. A driving voltage can be applied to the metal contact layer 61 and 60, while a control voltage is applied to the polysilicon gate 30 to decide whether the source region and drain region of the DMOS are conductive with each other.

Although trenched power transistors are better than planar ones, the process for forming a trenched power transistor needs more lithographic processes because a trenched power transistor has a more complex structure than a planar one. It is desirable to provide an improved process for forming trenched power transistors.

In addition, because the power transistor devices usually bear a high voltage, a termination structure is necessary for preventing electric breakdown from early happening. There are several conventional termination structures widely used, such as a local oxidation of silicon (LOCOS), a field plate, and a guard ring, etc., among which the LOCOS is the simplest. As shown in FIG. 1F, a termination structure of a field oxide layer 22 is at the right side of the figure. The thickness of the field oxide layer 22 can reach hundreds of nanometers. To form the field oxide layer 22, a special mask for the active area is needed in the process. As shown in FIG. 1A, the initial oxide layer 20 is formed through the active area mask. Then, the initial oxide layer 20 is thermally grown to be the field oxide layer 22.

Moreover, it is for the field oxide layer 22 as the main portion of a termination structure. As shown in FIG. 1A, after the formation of the initial oxide layer 20, an ion implantation process of P-type dopants is performed by using the initial oxide layer 20 as a mask to form a P-type active area 12. Therefore, the dopant concentration of the P-type active area 12 cannot be homogeneous. It impacts on the electric properties of the edge of the P-type active area and makes the device design more difficult. A cylindrical type of the P-N junction would be formed at the edge of the P-type active area 12, so as to make the current more dense. Therefore, it causes electric breakdown to happen easily.

Due to the process characteristics of the LOCOS method, the field oxide layer 22 has a bird beak structure penetrating into the neighboring P-type active area 12. Not only does it affect the precision of the transistor device dimension, but also causes electric field crowding in the neighborhood. This results in the increase of leakage current and decline of the performance of the active area.

In order to solve the above problem, there have been some designs proposed. FIG. 2, depicts a conventional DMOS device and its termination structure, as described in U.S. Pat. No. 6,309,929. The '929 patent uses an epitaxial layer to form an active area 12 of the DMOS device and also uses a first trench 14 as the main portion of the termination structure. Afterward, a gate oxide layer 21 and a polysilicon layer are subsequently formed (not shown). The polysilicon re-fills the first trench 14 and a plurality of DMOS trenches 13. Without a lithographic process, the redundant polysilicon layer is removed by an etchback in order to form a plurality of polysilicon gates 30 and a polysilicon sidewall 33 of the first trench 14. Afterward, the exposed gate oxide layer 21 is removed, and then a dielectric oxide layer 53 is deposited. Without a lithographic process, the redundant dielectric oxide layer 53 is removed by an etchback process in order to make the dielectric oxide layer cover the surface of the polysilicon gates 30 and the polysilicon sidewall 33. Thereafter, a TEOS layer 54 is deposited and then processed by the lithographic and etching processes to define the source regions 40. Afterward, a source metal layer 60 is deposited. Through a lithographic and etching process, the source metal layer 60 only covers the P-type active area 12 and extends toward the termination structure by a certain distance.

The '929 patent can eliminate the lithographic processes applied to the polysilicon layer and used to form the field oxide layer 22. However, due to the process characteristics, the thickness of the dielectric oxide layer 53 is limited, so that it affects the efficiency of the isolation between the polysilicon gate and the source metal contact layer.

In addition, for the power transistor design, to prevent the effect of electrostatic discharge, an ESD (electrostatic discharge) device 16 is introduced as a protective method. As shown in FIG. 3, a typical ESD is illustrated. For forming an ESD polysilicon layer 34, there must be one more lithographic process to define the location of the ESD polysilicon layer 34.

BRIEF SUMMARY OF THE INVENTION

Embodiments of the present invention provide a new termination structure to replace the conventional field oxide layer. Not only is the termination structure formed simultaneously during the process of the power transistor, but it also prevents the electric field crowding resulting from the bird beak of the field oxide layer. The present invention solves the problems coming from the formation of the P-type active area with an implantation or thermal diffusion methods.

In accordance with an aspect of the present invention, a trenched DMOS device having a termination structure comprises a silicon substrate of a first conductive type, having a first epitaxial layer of the first conductive type and a second epitaxial layer of a second conductive type formed thereon. A DMOS trench is formed in the first epitaxial layer and the second epitaxial layer. A first trench is formed in the first epitaxial layer and the second epitaxial layer disposed close to an edge of the second epitaxial layer. The first trench is to be utilized as a main portion of the termination structure having a bottom disposed in the first epitaxial layer. A second trench is disposed between the DMOS trench and the first trench. The second trench has another bottom disposed in the second epitaxial layer adjacent to a region of the second conductive type. A gate oxide layer is disposed on the DMOS trench and the first trench. The gate oxide layer has extended portions covering an upper surface of the second epitaxial layer adjacent the DMOS trench and of the second epitaxial layer adjacent the first trench. A first polysilicon layer is formed in the DMOS trench. A second polysilicon layer is formed over the gate oxide layer in the first trench, and has another extended portion covering the upper surface of the second epitaxial layer adjacent the first trench. The second polysilicon layer has an opening to expose the gate oxide layer disposed at the bottom of the first trench to split the second polysilicon layer into two discrete parts. An isolation layer is formed on the first polysilicon layer in the DMOS trench and extended portions of the gate oxide layer adjacent the DMOS trench, on the second polysilicon layer, and on the gate oxide layer over the second epitaxial layer at the bottom of the first trench. The isolation layer has a first contact window to expose the second polysilicon layer over the second epitaxial layer and a second contact window to expose the second trench. A source metal contact layer is formed over the isolation layer and fills both the first contact window and the second contact window. The source metal contact layer has a connection with a source of the DMOS device and further having an edge beside the first contact window.

In accordance with another aspect of the invention, a semiconductor device set comprises at least one trench-typed MOSFET and a trench-typed termination structure. The trench-typed MOSFET has a trench profile and comprises a gate oxide layer in the trench profile, and a polysilicon layer on the gate oxide layer. The trench-typed termination structure has a trench profile and comprises an oxide layer in the trench profile. A termination polysilicon layer with discrete features separates the termination polysilicon layer. An isolation layer covers the termination polysilicon layer and filling the discrete features.

In some embodiments, the at least one trench-typed MOSFET and the trench-typed termination structure are formed on a DMOS device comprising an N+ silicon substrate, an N epitaxial layer on the N+ silicon substrate, and a P epitaxial layer on the N epitaxial layer. The trench profiles of the trench-typed MOSFET and of the trench-typed termination structure penetrate through the P epitaxial layer into the N epitaxial layer. The DMOS device further comprises a first P region located between the trench-typed termination structure and the trench-typed MOSFET which is adjacent to the trench-typed termination structure, at least one second P region located between the trench-typed MOSFETs, at least one N source region surrounding the trench profiles.

The conventional technology uses the field oxide layer as the termination structure. For forming the field oxide layer, there must be one lithographic process of the active area used to define the location of the field oxide layer during the manufacturing processes. Moreover, the conventional technology uses the ion implantation to define the active area. However, due to the limitation of the ion implantation, the dope concentration of the active area can be quite homogeneous.

Compared with the conventional technology, embodiments of the present invention use an isolation trench to replace the field oxide layer. The isolation trench can be formed simultaneously during the process of etching gate trenches. Therefore, a conventional lithographic process for defining the location of the field oxide layer therefore is no longer needed. In addition, by using an epitaxial layer to form an active area, the uniform dopant concentration can be obtained.

DETAILED DESCRIPTION OF THE INVENTION

The exemplary embodiment of the invention disclosed herein is directed to a termination structure of DMOS device. In the following description, numerous details are set forth in order to provide a clear understanding of the present invention. It will be appreciated by one skilled in the art that variations of these specific details are possible while still achieving the results of the present invention. In other instance, well-known components are not described in detail in order not to unnecessarily obscure the present invention.

As illustrated in FIGS. 4A through 4F, a sequence for forming a trenched DMOS and a termination structure is disclosed in accordance with the exemplary embodiment of the present invention.

Figure 4A:
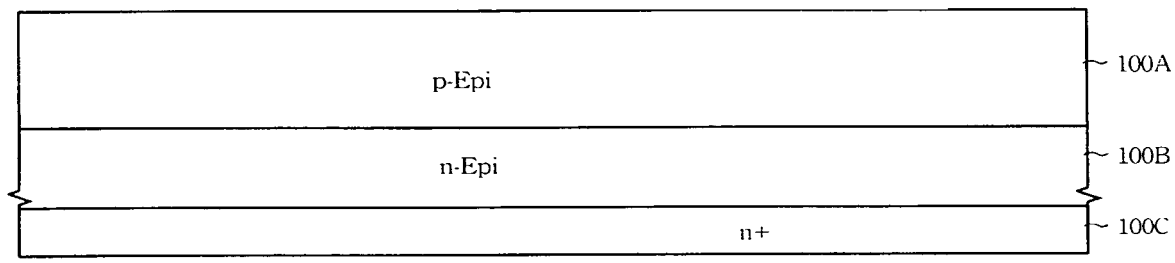
FIGS. 4A through 4F depict a sequence of steps to form a trenched DMOS and a termination structure thereof in accordance with an embodiment of the present invention.

In FIG. 4A, a first epitaxial layer 100B with N-type doping and a second epitaxial layer 100A with P-type doping are sequentially formed on the surface of an N+ silicon substrate 100C. The first epitaxial layer 100B and the second epitaxial layer 100A are then to establish a PN junction interface.

Figure 4B:
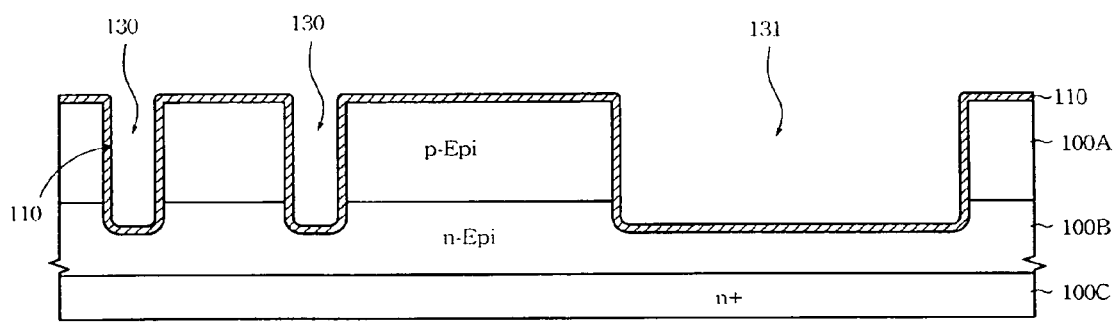

In FIG. 4B, a plurality of DMOS trenches 130 having a width of about 0.15~1.5 micron and a first trench 131 having a width of about 5~50 micron are formed in the first and second epitaxial layers 100B, 100A by lithographic and etching processes. In a preferred embodiment, the DMOS trench 130 has a width of about 0.4~0.6 micron and the first trench 131 to has a width of about 15~25 micron.

Afterward, a thermal oxidation process is carried out to form a gate oxide layer 110. The gate oxide layer may have a thickness of about 15~100 nm. In a preferred embodiment, the gate oxide layer 110 has a thickness of about 30~70 nm. The bottom of the first trench 131 to be utilized as a the main part of the termination structure is located in the first epitaxial layer 100B. The bottoms of the DMOS trenches 130 are also located in the first epitaxial layer 100B.

Figure 4C:
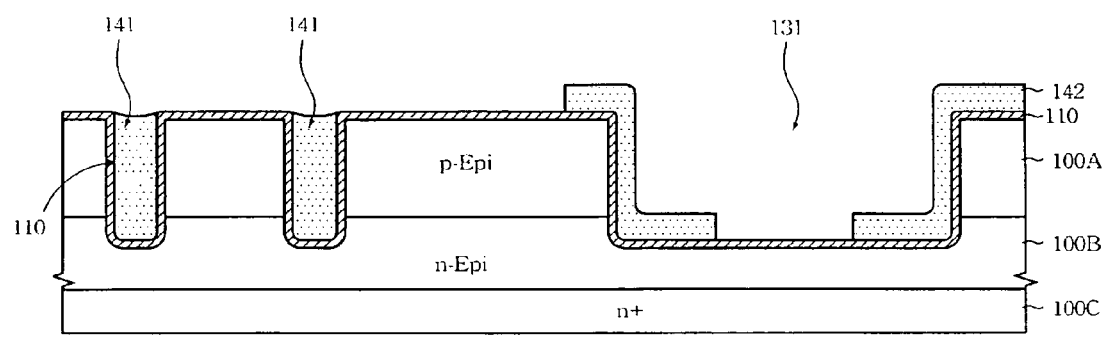

In FIG. 4C, a polysilicon layer is deposited to fill the DMOS trenches 130 and stack atop the gate oxide layer 110 in the first trench 131. Then, using lithographic and etching processes, a plurality of first polysilicon layers 141 and a second polysilicon layer 142 are formed. The first polysilicon layers 141 are utilized to form the polysilicon gate and combined with the second epitaxial layer 100A and the gate oxide layer 110 to form a MOS structure. The second polysilicon layer 142 is formed on the gate oxide layer 110 in the first trench 131 and extends to cover a portion of the gate oxide layer over the top surface of the second epitaxial layer 10A. The portion of the second polysilicon layer 142, located in the bottom of the first trench, has an opening to divide the layer 142 into two discrete parts.

Figure 4D:
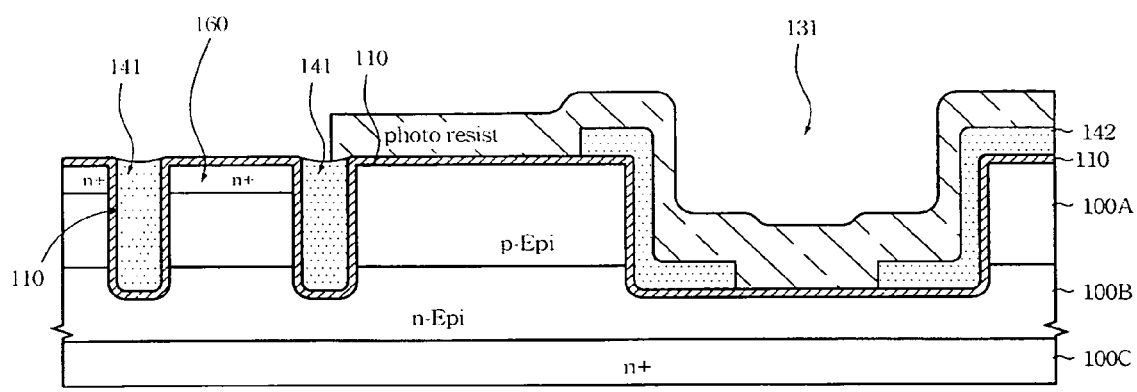

In FIG. 4D, a lithographic technique is applied to the surface of the second epitaxial layer 100A between two adjacent gates of the DMOS trenches 130. An ion implantation process of N-type dopants is performed to form N+ diffused regions 160.

Figure 4E:
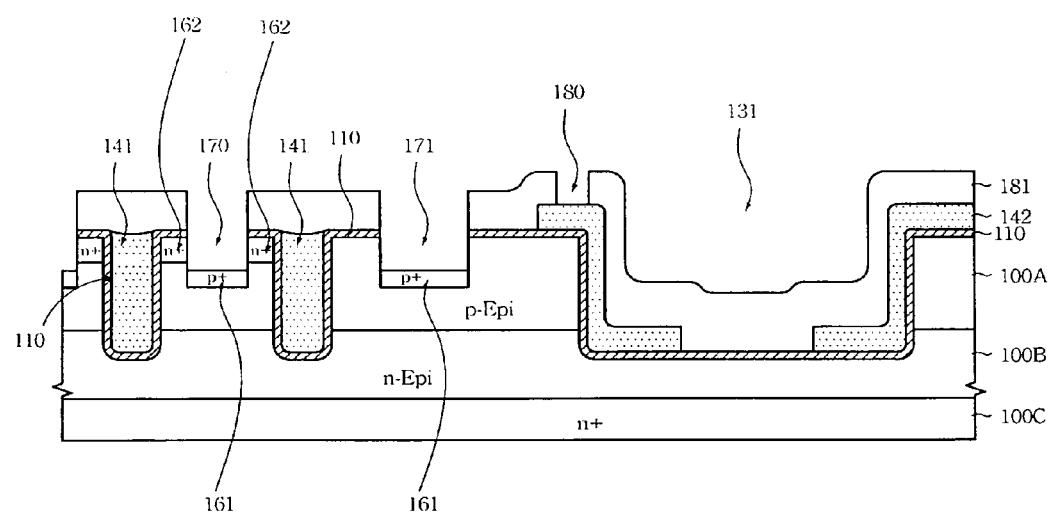

In FIG. 4E, after forming an isolation layer 181 is formed. Afterward, lithographic and a two-step etching processes are carried out. The first etching step is utilized to form a plurality of contact windows 170 of the active area in the isolation layer 181 on the respective N+ regions 160. A second trench 171 is formed in the isolation layer 181 between the DMOS trench 130 (now first polysilicon layer 141) and the first trench 131. Simultaneously, a first contact window 180 is formed with an etching process on the isolation layer 181 over the top surface of the second epitaxial layer 100A to expose the second polysilicon layer 142. Afterward, a second etching step is carried out by using the isolation layer 181 as a mask to remove the exposed N+ regions 160 and to form N+ source regions 162. An ion implantation process of P-type dopants is then performed to form P+ regions 161 at the bottoms of the contact windows 170 of the active area and the second trench 171.

As shown, an NPN bipolar transistor structure is formed by the N-type DMOS source 162, the P-type second epitaxial layer 10A, and the N-type first epitaxial layer 100B. Combining the bipolar transistor structure with the DMOS gate formed in the second epitaxial layer 10A, the gate oxide layer 110, and the first polysilicon layer 141, a complete DMOS transistor is formed.

Figure 4F:
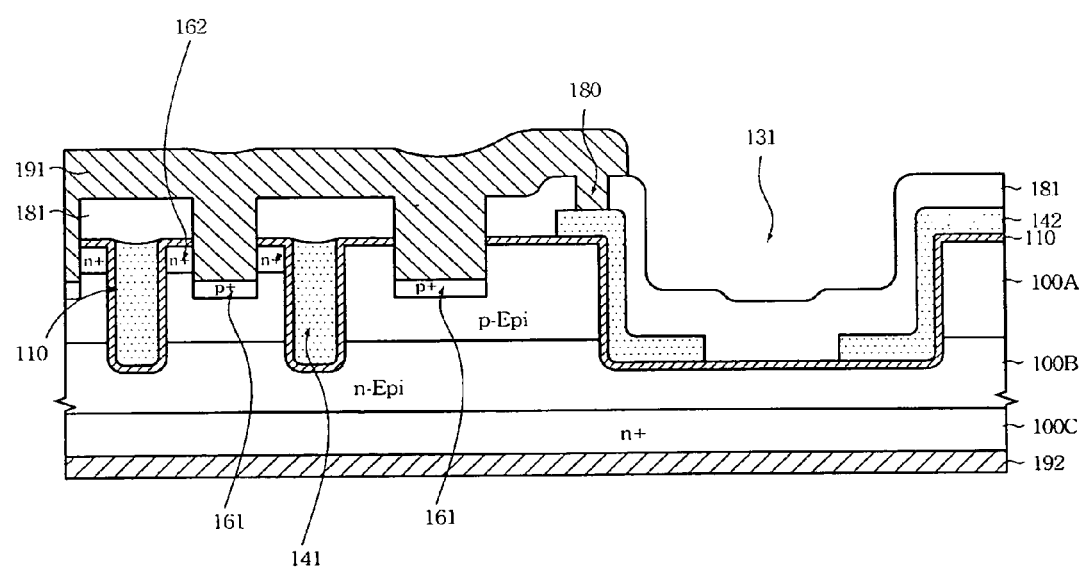

Finally, referring to FIG. 4F, a metal layer is deposited. Lithographic and etching processes are performed to remove the metal layer over the first trench 131 to form a source metal contact layer 191. The source metal contact layer 191 connects to the N+ source regions 162 through the contact windows 170 of the active area. The source metal contact layer 191 connects to the second epitaxial layer 100A through the P+ regions 161 beneath the bottoms of the contact windows 170 of the active area and the second trench 171. The source metal contact layer 191 connects to the second polysilicon layer 142 through the first contact window 180.

As mentioned, the N-type sources 162, the P-type second epitaxial layer 10A, and the source metal contact layer 191 have the same electrical potential. By applying a driving voltage to a drain metal contact layer 192 deposited on the backside of the silicon substrate 100C and a control voltage to the first polysilicon layer 141, the operation of the DMOS device can be controlled.

In a preferred embodiment, the isolation layer 181 may be formed of doped silicate glass, and the source metal contact layer 191 may be composed of a stack of Ti, TiN, and AlSiCu alloy layers.

The above-described embodiment is based on the usage of N+ silicon substrate. Therefore, if a P+ silicon substrate is used instead, all the N-type dopants should be replaced by P-type dopants, and vice versa.

Figure 5:
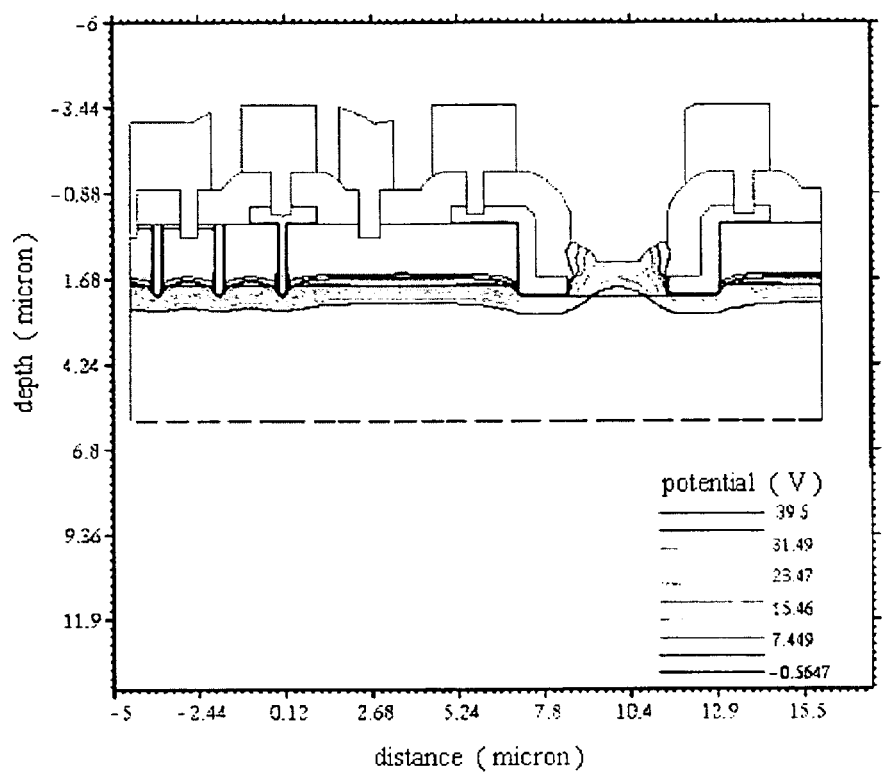
FIG. 5 depicts a computer simulation model of equivalent electric potential distribution of a trenched DMOS and a termination structure thereof in accordance with an embodiment of the present invention.

In FIG. 5, a computer simulation model of electrical potential distribution of a trenched DMOS and a termination structure thereof in accordance with the exemplary embodiment of the present invention is shown. Because the electric potentials of the second polysilicon layer 142, the P-type second epitaxial layer 10A, and the sandwiched gate oxide layer 110 are the same, the electrical potential gradient existing near the first trench 131 in the second epitaxial layer 100A close to the first trench 131 can be avoided to prevent current leakage. In addition, the electrical potential lines beneath the second epitaxial layer 100A adjacent to the first trench 131 bend so as to prevent electric field crowding.

Figure 6:
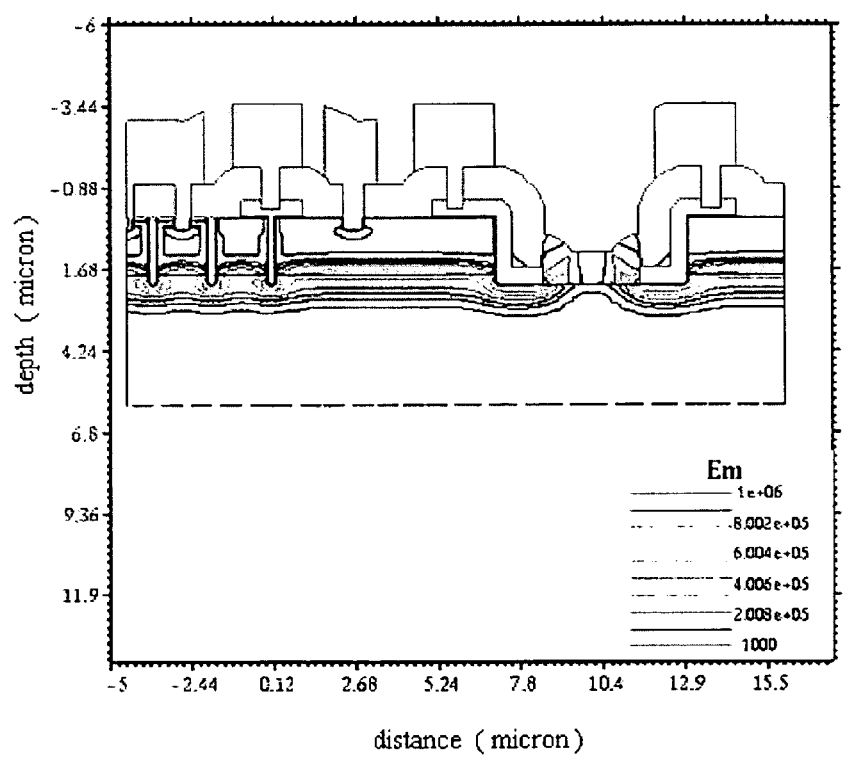
FIG. 6 depicts a computer simulation model of electric field intensity distribution of a trenched DMOS and a termination structure thereof in accordance with an embodiment of the present invention.

In FIG. 6, a computer simulation model of electric field intensity distribution of a trenched DMOS and a termination structure thereof in accordance with the exemplary embodiment of the present invention is shown. There is a highly crowded region located in the first epitaxial layer 100B near the bottom of the first trench 131, which is purposely away from the active devices so as to prevent electric breakdown from early happening. In addition, there is an opening formed in the second polysilicon layer 142 in the bottom surface of the first trench 131. The opening is utilized as a channel stop structure to reduce γ current leakage.

In contrast to the prior art in FIG. 1, which uses the field oxide layer 22 as a termination structure, the technique provided by the present embodiment can eliminate the mask for defining the position of the active area and the corresponding lithographic process. Also, by replacing the field oxide layer 22 with the first trench 131, the electric field crowding event resulting from a bird beak can be avoided. In the prior art, for the field oxide layer 22 as a termination structure, the active area 12 is formed by the ion implantation or thermal diffusion process, so as to result in the formation of the cylindrical PN junction interface near the edge of the active area 12 to cause electric field crowding.

However, the present embodiment uses the second epitaxial layer 100A to form the active area 12 in order to prevent the formation of the cylindrical PN junction interface. The present embodiment also produces better homogeneity of the active area 12 to provide better electrical properties and more ideal criteria for IC design. In addition, because the field oxide layer 22 is replaced by the first trench 131, the termination structure according to the present embodiment changes its planar feature to a steric feature. It leads to not only the reduction of the area of the termination structure, but also the reduction of current leakage. Therefore, the device performance is improved.

Figure 1A:
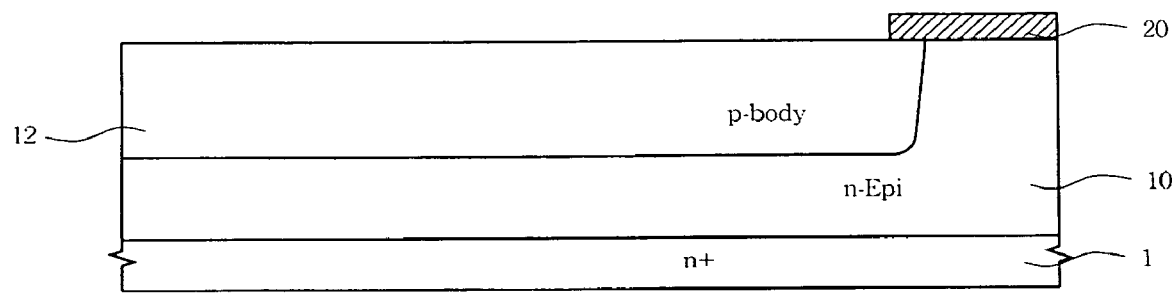
FIGS. 1A through 1F depict a sequence of steps to form a typical trenched DMOS and a termination structure thereof.
Figure 1B:
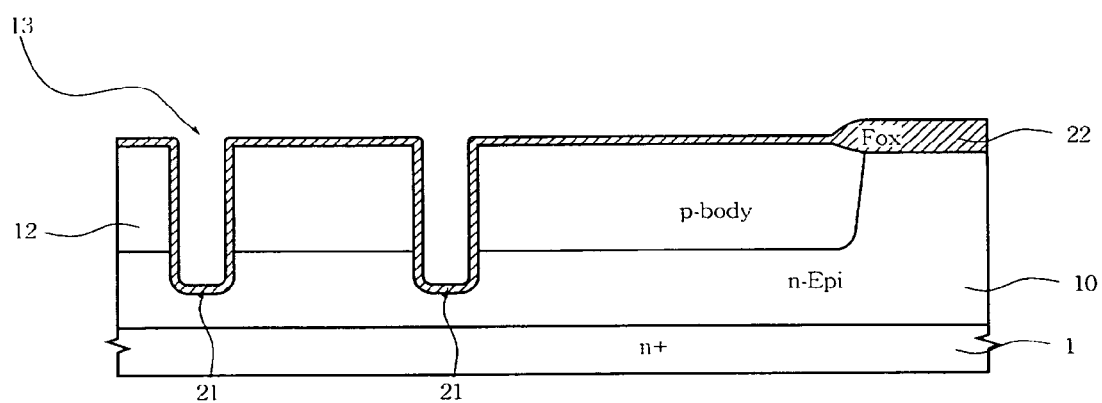
Figure 1C:
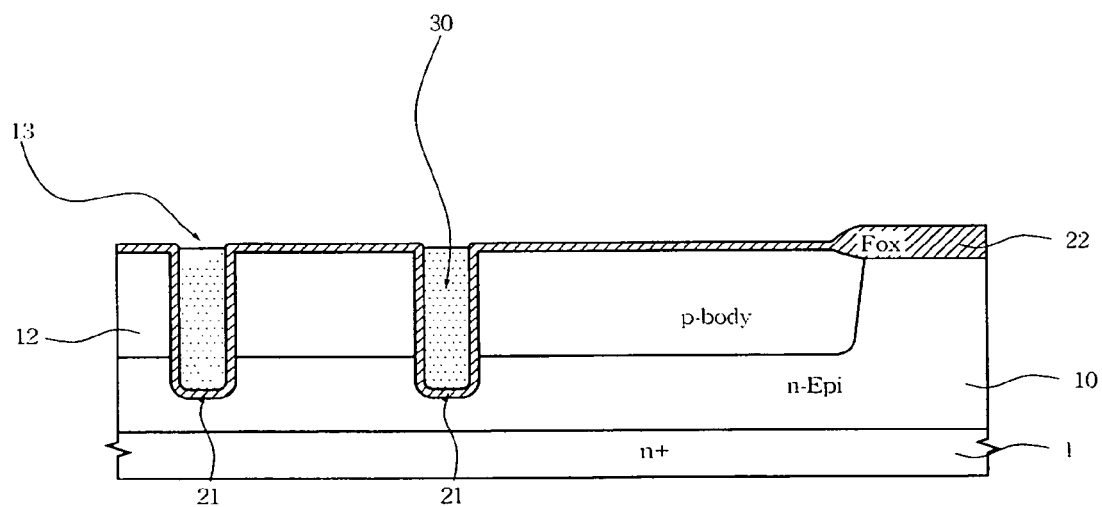
Figure 1D:
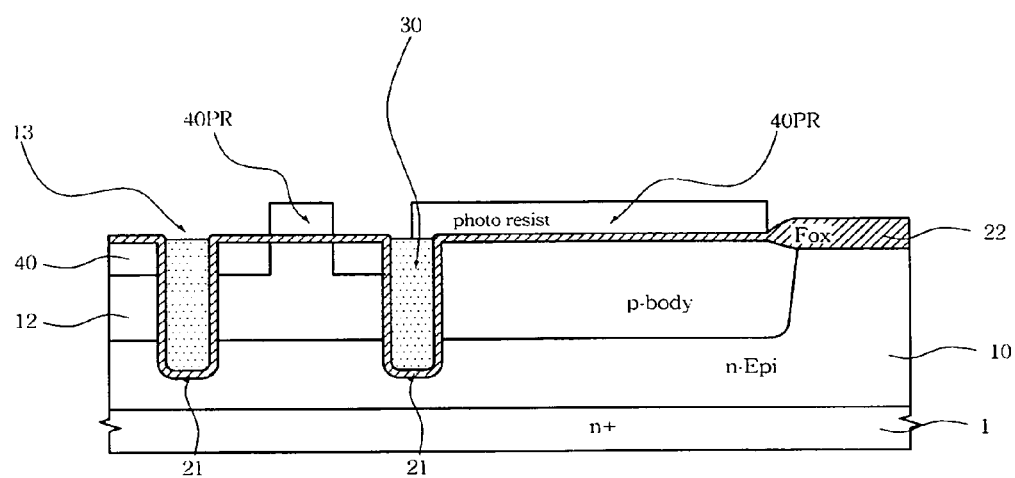
Figure 1E:
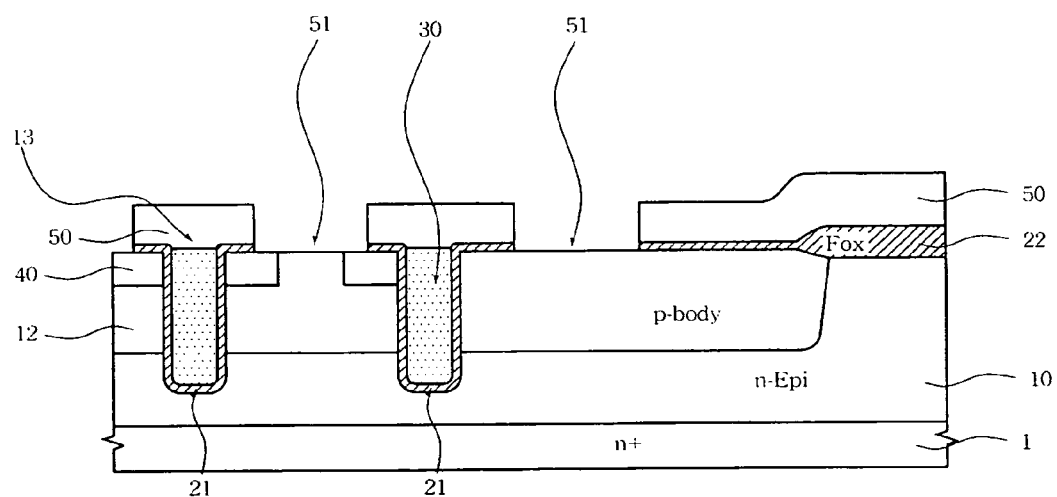
Figure 1F:
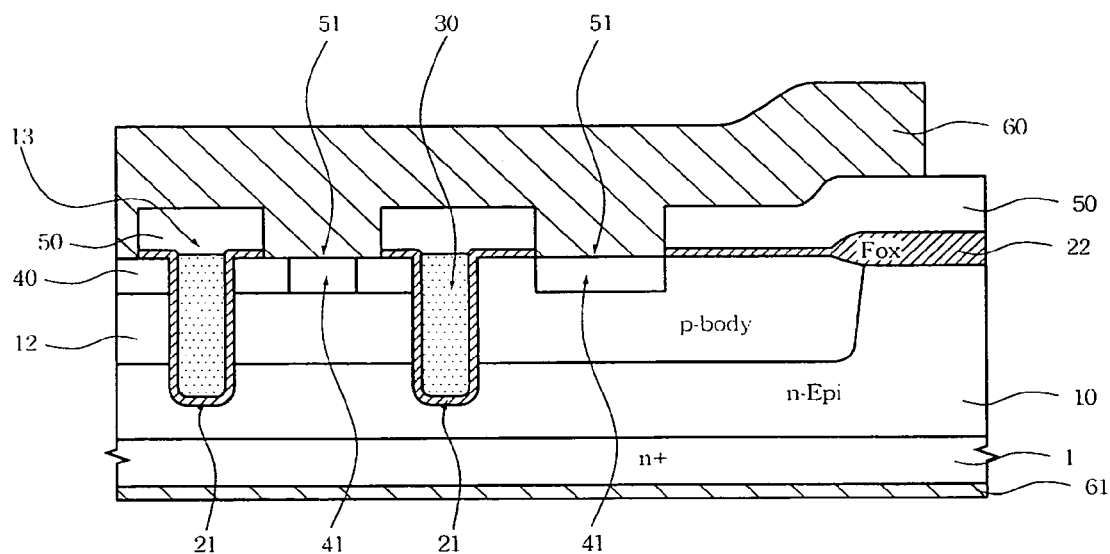
Figure 2:
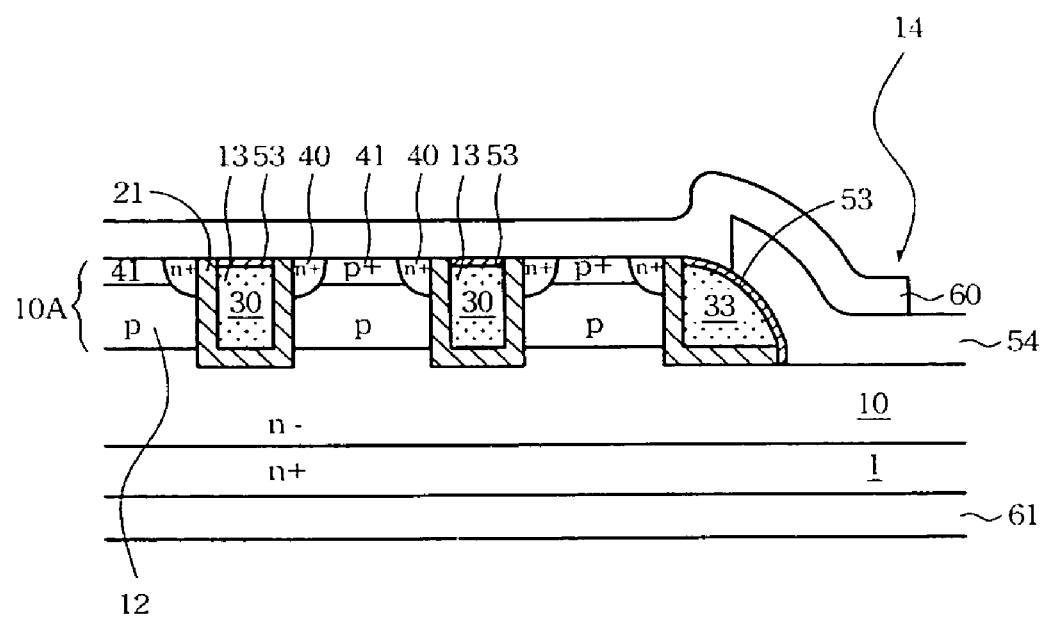
FIG. 2 depicts a conventional trenched DMOS and a termination structure.
Figure 3:
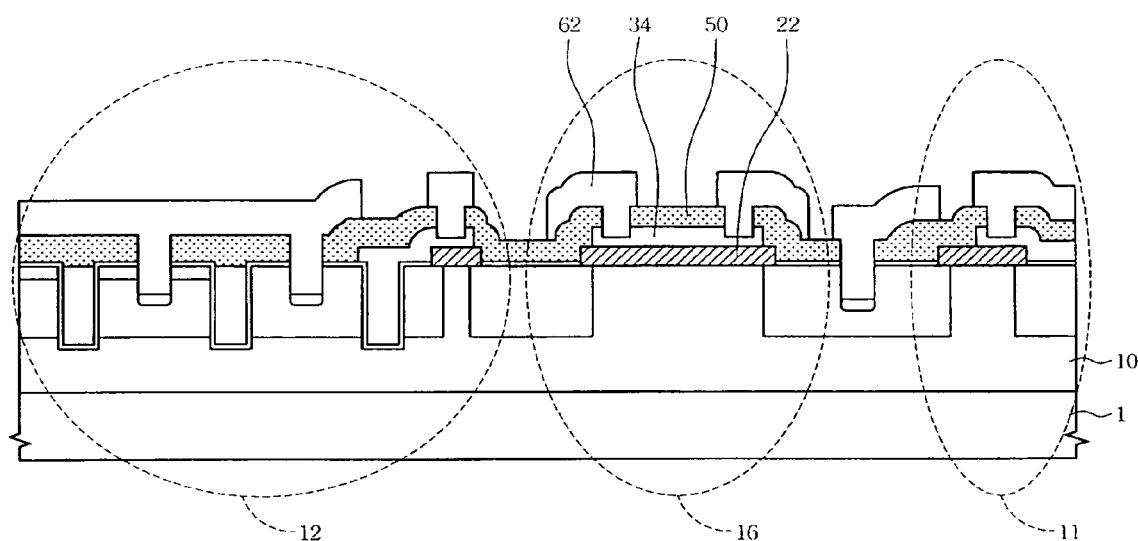
FIG. 3 depicts a traditional typical ESD circuit.

The DMOS device and the termination structure shown in FIG. 2 are compared with those of the present embodiment. The dielectric oxide layer 53 and the TEOS oxide layer 54 act as the isolation layer 181 of the present embodiment. The dielectric oxide layer 53 is formed by depositing an oxide layer and further applying a blank-etching process without a lithographic process. The TEOS oxide layer 54 is formed by depositing an oxide layer, using a lithographic process to define, and further applying an etching process. Contrarily, in the present embodiment, the formation of the isolation layer 181 also needs a lithographic process and an etching process, but it uses only one deposition. Moreover, for the DMOS device and the termination structure shown in FIG. 2, the polysilicon layer 20 and the dielectric oxide layer 53 are directly etched without a lithographic process. Therefore, to completely remove the undesired portion of the polysilicon layer 20 and the dielectric oxide layer 53, the etching process is more difficult to achieve. The dimension of the termination structure is limited. Compared with the prior art, the etching process for the isolation layer 181 of the present embodiment is not as limited as the prior art. The isolation protection is sufficient for isolating the gate and the source metal contact layer.

Also referring to the DMOS device and the termination structure shown in FIG. 2, the polysilicon sidewall 33 needs to connects with the gate. However, as shown in FIG. 4F in accord with present embodiment, the corresponding second polysilicon layer 142 connects with the source 191. Therefore, for the design of the present embodiment, the potential of the second polysilicon layer 142, the P-type second epitaxial layer 10A, and the gate oxide layer 110 is the same. It prevents electric field crowding near the first trench 131 in the second epitaxial layer 100A.

Figure 7:
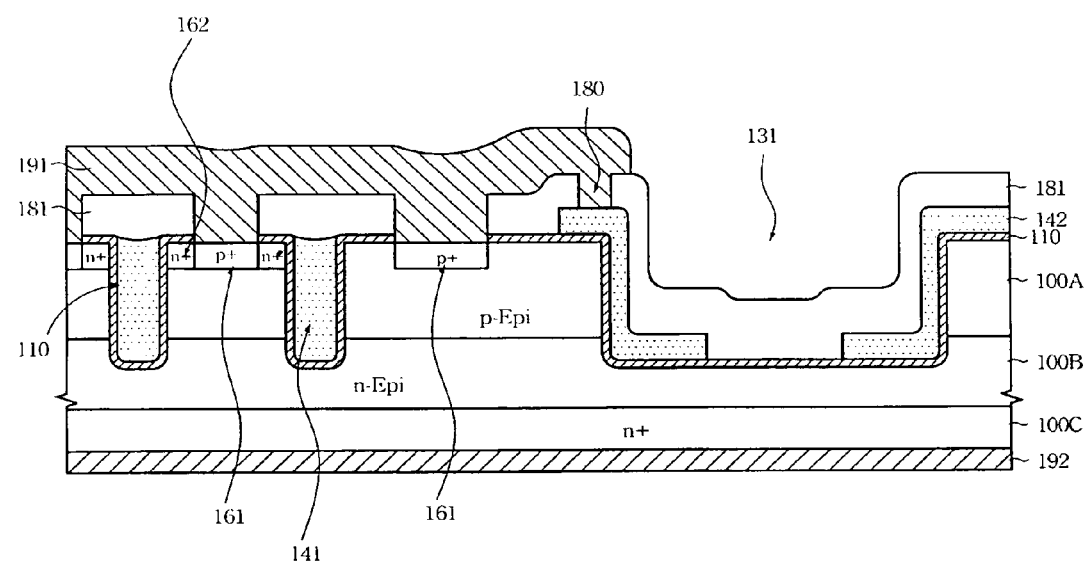
FIG. 7 depicts a cross-section view of another embodiment of a trenched DMOS and a termination structure thereof.

In another embodiment, as shown in FIG. 7, compared to the embodiment shown in FIG. 4E, a one-step etching process is carried out by using the second epitaxial layer 100A as an etching stop layer to form the contact windows 170 of the active area and the second trench 171. Therefore, the amount of P-type dopants implanted afterward must neutralize the existing N+ regions so as to form a plurality of P+ regions 161.

The above-described arrangements of apparatus and methods are merely illustrative of applications of the principles of this invention and many other embodiments and modifications may be made without departing from the spirit and scope of the invention as defined in the claims. For example, the shapes and sizes of the components that form the camera supporting device may be changed. The scope of the invention should, therefore, be determined not with reference to the above description, but instead should be determined with reference to the appended claims along with their full scope of equivalents.

What is claimed is:

1. A trenched DMOS device having a termination structure, the trenched DMOS device comprising:
   a silicon substrate of a first conductive type, having a first epitaxial layer of the first conductive type and a second epitaxial layer of a second conductive type formed thereon;
   a DMOS trench, formed in the first epitaxial layer and the second epitaxial layer;
   a first trench, formed in the first epitaxial layer and the second epitaxial layer disposed close to an edge of the second epitaxial layer, the first trench to be utilized as a main portion of the termination structure having a bottom disposed in the first epitaxial layer;
   a second trench disposed between the DMOS trench and the first trench, the second trench having another bottom disposed in the second epitaxial layer adjacent to a region of the second conductive type;
   a gate oxide layer on the DMOS trench and the first trench, the gate oxide layer having extended portions covering an upper surface of the second epitaxial layer adjacent the DMOS trench and of the second epitaxial layer adjacent the first trench;
   a first polysilicon layer, formed in the DMOS trench;
   a second polysilicon layer, formed over the gate oxide layer in the first trench, having another extended portion covering the upper surface of the second epitaxial layer adjacent the first trench, the second polysilicon layer having an opening to expose the gate oxide layer disposed at the bottom of the first trench to split the second polysilicon layer into two discrete parts;
   an isolation layer, formed on the first polysilicon layer in the DMOS trench and extended portions of the gate oxide layer adjacent the DMOS trench, on the second polysilicon layer, and on the gate oxide layer over the second epitaxial layer at the bottom of the first trench, the isolation layer having a first contact window to expose the second polysilicon layer over the second epitaxial layer and a second contact window to expose the second trench; and
   a source metal contact layer, formed over the isolation layer and filling both the first contact window and the second contact window, having a connection with a source of the DMOS device and further having an edge beside the first contact window.

2. The trenched DMOS device of claim 1, wherein the isolation layer includes a plurality of body contact windows extending into the second epitaxial layer, and wherein the source metal contact layer is formed over the body contact windows.

3. The trenched DMOS device of claim 1, further comprising a drain metal contact layer formed on a backside surface of the silicon substrate.

4. The trenched DMOS device of claim 1, wherein the isolation layer comprises doped silicate glass.

5. The trenched DMOS device of claim 1, wherein the source metal contact layer comprises a stack of Ti, TiN, and AlSiCu alloy.

6. The trenched DMOS device of claim 1, wherein the first conductive type is an N type and the second conductive type is a P type.

7. The trenched DMOS device of claim 1, wherein the first conductive type is a P type and the second conductive type is an N type.

8. A trenched DMOS device having a termination structure, the trenched DMOS device comprising:
   a silicon substrate of a first conductive type, having a first epitaxial layer of the first conductive type and a second epitaxial layer of a second conductive type formed thereon;
   a pair of DMOS gates, formed in the first epitaxial layer and the second epitaxial layer and being spaced by a body contact window;
   a first trench, formed in the first epitaxial layer and the second epitaxial layer disposed close to an edge of the second epitaxial layer, the first trench to be utilized as a main portion of the termination structure having a bottom disposed in the first epitaxial layer;
   a second trench disposed between the DMOS gates and the first trench, the second trench having a bottom disposed in the second epitaxial layer adjacent to a region of the second conductive type;
   a gate oxide layer on the first trench, the gate oxide layer having extended portions covering an upper surface of the second epitaxial layer adjacent the first trench;
   a second polysilicon layer, formed over the gate oxide layer in the first trench, having another extended portion covering the upper surface of the second epitaxial layer adjacent the first trench, the second polysilicon layer having an opening to expose the gate oxide layer disposed at the bottom of the first trench to split the second polysilicon layer into two discrete parts;
   an isolation layer, formed on the DMOS gate, on the second polysilicon layer, and on the gate oxide layer over the second epitaxial layer at the bottom of the first trench, the isolation layer having a first contact window to expose the second polysilicon layer over the second epitaxial layer and a second contact window to expose the second trench; and
   a source metal contact layer, formed over the isolation layer and filling both the first contact window and the second contact window, having a connection with a source of the DMOS device and further having an edge beside the first contact window.

9. The trenched DMOS of claim 8 wherein the pair of gates are spaced by a bipolar transistor structure.

10. The trenched DMOS of claim 8 wherein the source metal contact layer is formed over the body contact windows.

11. A semiconductor device set comprising at least one trench-typed MOSFET and a trench-typed termination structure; wherein the trench-typed MOSFET has a trench profile and comprises a gate oxide layer in the trench profile, and a polysilicon layer on the gate oxide layer; wherein the trench-typed termination structure has a trench profile and comprises an oxide layer in the trench profile, a termination polysilicon layer with discrete features separating the termination polysilicon layer, an isolation layer covering the termination polysilicon layer and filling the discrete features, wherein the at least one trench-typed MOSFET and the trench-typed termination structure are formed on a DMOS device comprising an N+ silicon substrate, an N epitaxial layer on the N+ silicon substrate, and a P epitaxial layer on the N epitaxial layer;
   wherein the termination polysilicon layer has an opening to expose the bottom of the trench profile of the trench-type termination structure to split the terminal polysilicon layer into two discrete parts, and wherein the isolation layer is formed over the two discrete parts of the termination polysilicon layer and the bottom of the trench profile of the trench-type termination structure to fill the discrete features.

12. A semiconductor device set comprising at least one trench-typed MOSFET and a trench-typed termination structure; wherein the trench-typed MOSFET has a trench profile and comprises a gate oxide layer in the trench profile, and a polysilicon layer on the gate oxide layer; wherein the trench-typed termination structure has a trench profile and comprises an oxide layer in the trench profile, a termination polysilicon layer with discrete features separating the termination polysilicon layer, an isolation layer covering the termination polysilicon layer and filling the discrete features, wherein the at least one trench-typed MOSFET and the trench-typed termination structure are formed on a DMOS device comprising an N+ silicon substrate, an N epitaxial layer on the N+ silicon substrate, and a P epitaxial layer on the N epitaxial layer,
   wherein the trench profiles of the trench-typed MOSFET and of the trench-typed termination structure penetrate through the P epitaxial layer into the N epitaxial layer.

13. A semiconductor device set comprising at least one trench-typed MOSFET and a trench-typed termination structure; wherein the trench-typed MOSFET has a trench profile and comprises a gate oxide layer in the trench profile, and a polysilicon layer on the gate oxide layer; wherein the trench-typed termination structure has a trench profile and comprises an oxide layer in the trench profile, a termination polysilicon layer with discrete features separating the termination polysilicon layer, an isolation layer covering the termination polysilicon layer and filling the discrete features, wherein the at least one trench-typed MOSFET and the trench-typed termination structure are formed on a DMOS device comprising an N+ silicon substrate, an N epitaxial layer on the N+ silicon substrate, and a P epitaxial layer on the N epitaxial layer,
   wherein the DMOS device further comprises a first P region located between the trench-typed termination structure and the trench-typed MOSFET which is adjacent to the trench-typed termination structure, at least one second P region located between the trench-typed MOSFETs, at least one N source region surrounding the trench profiles.

* * * * *